(12) United States Patent
Xiao et al.

(10) Patent No.: US 10,170,356 B2
(45) Date of Patent: Jan. 1, 2019

(54) SOI SUBSTRATE AND MANUFACTURING METHOD THEREOF

(71) Applicant: ZING SEMICONDUCTOR CORPORATION, Shanghai (CN)

(72) Inventors: Deyuan Xiao, Shanghai (CN); Richard R. Chang, Shanghai (CN)

(73) Assignee: ZING SEMICONDUCTOR CORPORATION, Shanghai (CN)

( * ) Notice: Subject to any disclaimer, the term of this patent is extended or adjusted under 35 U.S.C. 154(b) by 78 days.

(21) Appl. No.: 15/198,805

(22) Filed: Jun. 30, 2016

(65) Prior Publication Data
US 2017/0256438 A1  Sep. 7, 2017

(30) Foreign Application Priority Data

Mar. 3, 2016 (CN) .......................... 2016 1 0120843

(51) Int. Cl.
*H01L 21/762* (2006.01)
*H01L 21/02* (2006.01)
*H01L 29/34* (2006.01)

(52) U.S. Cl.
CPC .. *H01L 21/76254* (2013.01); *H01L 21/02032* (2013.01); *H01L 21/02164* (2013.01); *H01L 29/34* (2013.01)

(58) Field of Classification Search
CPC . H01L 21/2007; H01L 21/3003; H01L 29/51; H01L 29/78654; H01L 21/76254; H01L 21/324; H01L 27/1203
See application file for complete search history.

(56) References Cited

U.S. PATENT DOCUMENTS

| 6,995,075 | B1 | 2/2006 | Usenko |
| 7,148,124 | B1 | 12/2006 | Usenko |
| 2004/0097055 | A1* | 5/2004 | Henley ............ H01L 21/76254 438/471 |
| 2006/0270192 | A1* | 11/2006 | Cheng ................ H01L 21/2007 438/459 |

(Continued)

FOREIGN PATENT DOCUMENTS

JP    H11330438    11/1999

OTHER PUBLICATIONS

Office Action dated Aug. 8, 2017 in Japan Patent Application No. 2016-139399, filed Aug. 4, 2016 (with English Language translation).

*Primary Examiner* — Jay C Chang
*Assistant Examiner* — Mikka Liu
(74) *Attorney, Agent, or Firm* — Huffman Law Group, PC

(57) ABSTRACT

This invention application provides a method for manufacturing a SOI substrate, and the method comprising: providing a first semiconductor substrate; growing a first insulating layer on a top surface of the first semiconductor substrate for forming a first wafer; irradiating the first semiconductor substrate via a ion beam for forming a doping layer to a pre-determined depth from a top surface of the first insulating layer; providing a second substrate; growing a second insulating layer on a top surface of the second semiconductor substrate for forming a second wafer; bonding the first wafer with the second wafer; annealing the first wafer and second wafer at a deuterium atmosphere; separating a part of the first wafer from the second wafer; and forming a deuterium doped layer on the second wafer.

17 Claims, 5 Drawing Sheets

(56) References Cited

U.S. PATENT DOCUMENTS

| | | | |
|---|---|---|---|
| 2010/0087046 A1* | 4/2010 | Ohnuma | H01L 21/2007 438/458 |
| 2010/0237458 A1* | 9/2010 | Kakehata | H01L 27/112 257/507 |
| 2010/0244093 A1* | 9/2010 | Rahimo | H01L 29/0834 257/142 |

* cited by examiner

SOI SUBSTRATE AND MANUFACTURING METHOD THEREOF

INCORPORATION BY REFERENCE

This application claims priority from P.R.C. Patent Application No. 201610120843.4, filed on Mar. 3, 2016, the contents of which are hereby incorporated by reference in their entirety for all purposes.

TECHNICAL FIELD

The present invention relates to a semiconductor substrate and a method for manufacturing the semiconductor substrate, and particularly relates to a silicon on insulator substrate and a method for manufacturing the silicon on insulator substrate.

BACKGROUND

In recent years, many industries have used silicon on insulator (SOI) substrate to manufacture a semiconductor integrated circuit instead of using a piece of a silicon wafer. Because using SOI substrate has an advantage of reducing the parasitic capacitance between the drain region and the substrate, whereby a performance of a semiconductor integrated circuit can be improved.

With regard to a method for manufacturing a semiconductor device, such as U.S. Pat. No. 5,374,564, which provides a method for doping hydrogen ions into a silicon wafer, and forming an ion doped layer at a pre-determined depth of the silicon wafer. Then the silicon wafer doped with hydrogen ions is coupled with another silicon wafer, and a silicon oxide film is formed between the two silicon wafers. Then the two silicon wafers are separated at the ion doped layer by heat treatment, whereby a monocrystalline silicon film can be formed on the ion doped layer.

For example, U.S. Pat. No. 5,872,387 provides a method for annealing a substrate growth, a gate oxide at a deuterium atmosphere, whereby dangling bonds between the gate oxide and the substrate can be removed. However, this method should be proceeding at a very high deuterium pressure, so that the cost for manufacturing a semiconductor device is increased.

In view of prior arts described above, it is needed an improved method for manufacturing a SOI substrate, which at least solve drawbacks described above.

SUMMARY

An object of the present invention application is to provide a silicon on insulator substrate and a method thereof, wherein the SOI substrate has an advantage of reducing the parasitic capacitance between the drain region and the substrate, and the cost for manufacturing the SOI substrate can be reduced as well.

In order to solve the above problems, the present invention application provides a method for manufacturing a SOI substrate. The method comprising: providing a first semiconductor substrate; growing a first insulating layer on a top surface of the first semiconductor substrate for forming a first wafer; irradiating the first semiconductor substrate via a ion beam for forming a doping layer to a pre-determined depth from a top surface of the first insulating layer; providing a second substrate; growing a second insulating layer on a top surface of the second semiconductor substrate for forming a second wafer; bonding the first wafer with the second wafer; annealing the first wafer and second wafer at a deuterium atmosphere; separating a part of the first wafer from the second wafer; forming a deuterium doped layer on the second wafer.

Our invention application further provides a SOI substrate comprising: a semiconductor substrate; an insulating layer grown on a top surface of the semiconductor substrate; and a deuterium doped layer grown on the insulating layer.

BRIEF DESCRIPTION OF THE DRAWINGS

Exemplary embodiments will be more readily understood from the following detailed description when read in conjunction with the appended drawing, in which.

DETAILED DESCRIPTION

For a more complete understanding of the present disclosure and its advantages, reference is now made to the following description taken in conjunction with the accompanying drawings, in which like reference numbers indicate like features. Persons having ordinary skill in the art will understand other varieties for implementing example embodiments, including those described herein.

Figure 1:
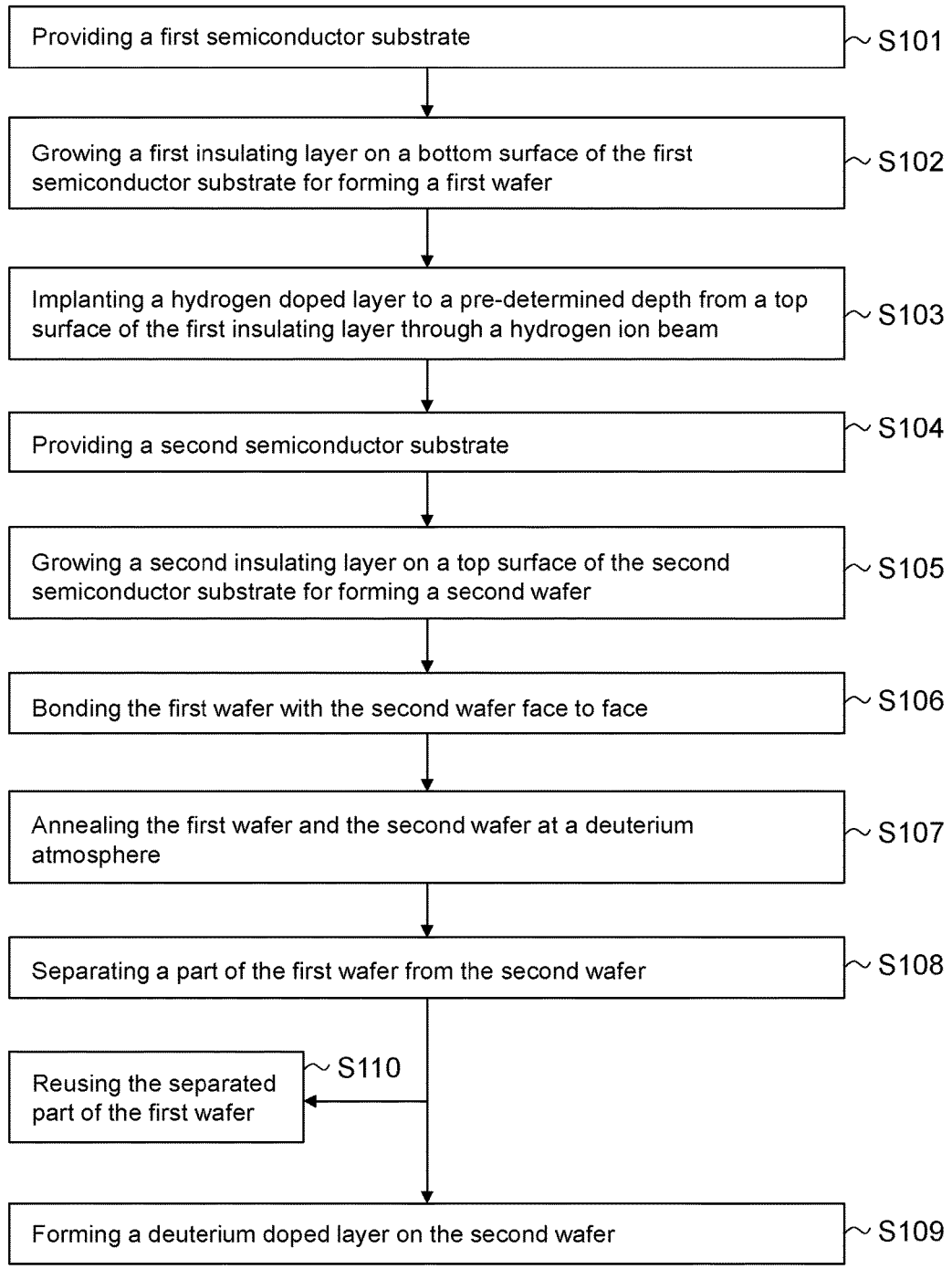
FIG. 1 is a flowchart of a method for manufacturing a silicon on insulator substrate according to one embodiment of the present invention.

FIG. 1 provides a method for manufacturing a silicon on insulator substrate according to one embodiment of this invention, and steps of the manufacture method comprising:

Step101(S101): providing a first semiconductor substrate;

Step102(S102): forming a first insulating layer on a bottom surface of the first semiconductor substrate for forming a first wafer;

Step103(S103): Hydrogen being used for a source gas, and irradiating the first semiconductor substrate via a hydrogen ion beam for forming a doping layer to a pre-determined depth from a top surface of the first insulating layer;

Step104(S104): providing a second semiconductor substrate;

Step105(S105): forming a second insulating layer on a top surface of the second semiconductor substrate for forming a second wafer;

Step106(S106): bonding the first wafer with the second wafer face to face;

Step107(S107): annealing the first wafer and the second wafer at a deuterium atmosphere;

Step108(S108): separating a part of the first wafer from the second wafer; and

Step109(S109): forming a deuterium doped layer on the second wafer;

Step 110(S110): reusing the separated part of the first wafer.

In order to describe the method for manufacturing the silicon on insulator more specifically, FIGS. 2A-2G provide cross-sectional views of a process for manufacturing a silicon on insulator substrate.

Figure 2A:
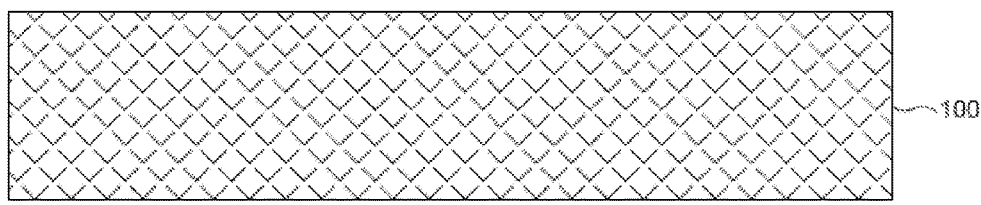
FIGS. 2A-2H are cross-sectional views of a process for manufacturing a silicon on insulator substrate.

The first step is referred to FIG. 2A, a first semiconductor substrate 100 is provided, wherein the material of the first semiconductor substrate 100 may be Group IV, SiGe, III-V group compound, Group III-Nitrogen compound, or II-VI group compound. In one embodiment, the material of the first semiconductor substrate 100 is single crystal silicon. In another embodiment, the material of the first semiconductor substrate 100 is SiGe, and the weight percent of germanium is between 5%~90%.

Figure 2B:
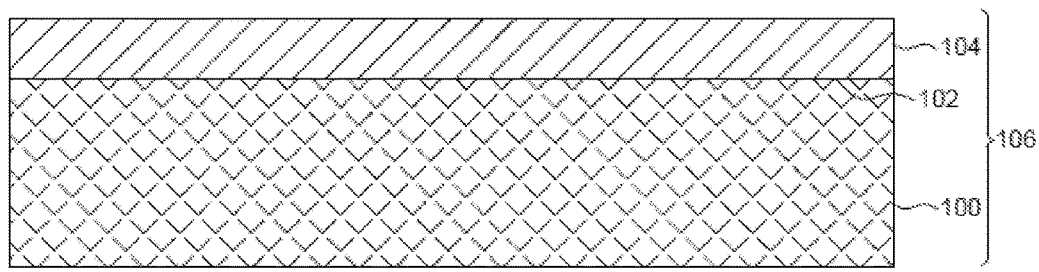

The next process is referred to FIG. 2B, a first insulating layer 104 is formed on a top surface 102 of the first semiconductor substrate 100 for a first wafer 106, wherein the material of the first insulating layer 104 may include silicon dioxide, silicon nitride, or aluminum nitride. In one embodiment, the material of the first insulating layer is silicon dioxide and the thickness of the first insulating layer 104 is between 0.1 nm and 500 nm.

Figure 2C:
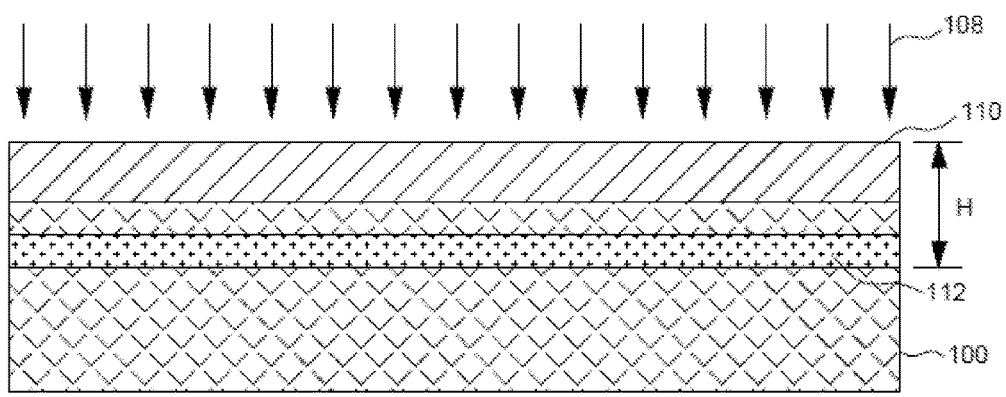
Figure 2D:
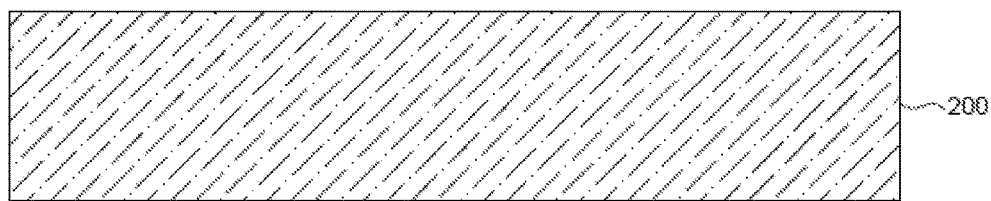

The next process is referred to FIG. 2C, hydrogen or deuterium may be used for a source gas, and the plasma of the source gas can be generated via an electric field effect. The ion beam of the source gas may be generated via using ions of the plasma.

In one embodiment, hydrogen is used for the source gas, and the first wafer 106 is irradiated by a hydrogen ion beam 108 for forming a hydrogen doped layer 112 to a pre-determined depth H from a top surface 110 of the first insulating layer 110. The pre-determined depth H may be controlled by an accelerated energy of the hydrogen ion beam 108 and an incidence angle of the hydrogen ion beam 108, wherein the accelerated energy of the hydrogen ion beam 108 may be controlled by an accelerated voltage and a doped concentration. In one embodiment, the pre-determined depth H is between 0.01 μm and 5 μm, an accelerated voltage of the hydrogen ion beam 108 is between 1 keV and 200 keV, and a doped dosage of the hydrogen ion beam 108 is between $10^{16}$ ions/cm$^2$ and $2 \times 10^{17}$ ions/cm$^2$. The next step is referred to FIG. 2D, a second semiconductor substrate 200 is provided, wherein the material of the second semiconductor substrate 200 may be Group IV, SiGe, III-V group compound, Group III-Nitrogen compound, or II-VI group compound. In one embodiment, the material of the second semiconductor substrate 200 is single crystal silicon.

Figure 2E:
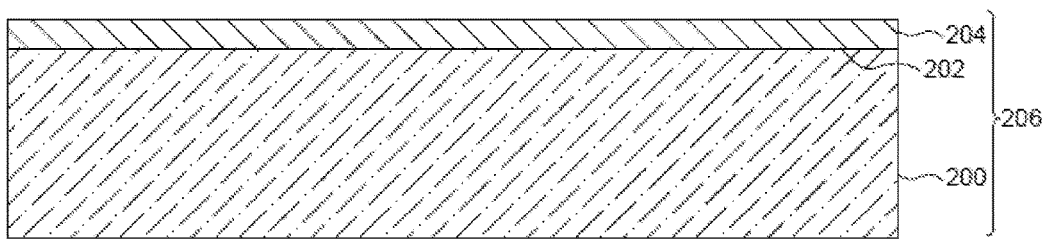

The next process is referred to FIG. 2E, a second insulating layer 204 is grown on a top surface 202 of the second semiconductor substrate 200 for a second wafer 206, wherein the material of the second insulating layer 204 may include silicon dioxide, silicon nitride, or aluminum nitride. In one embodiment, the material of the second insulating layer 204 is silicon dioxide and the thickness of the second insulating layer 204 may be between 0.05 nm and 10 nm.

Figure 2F:
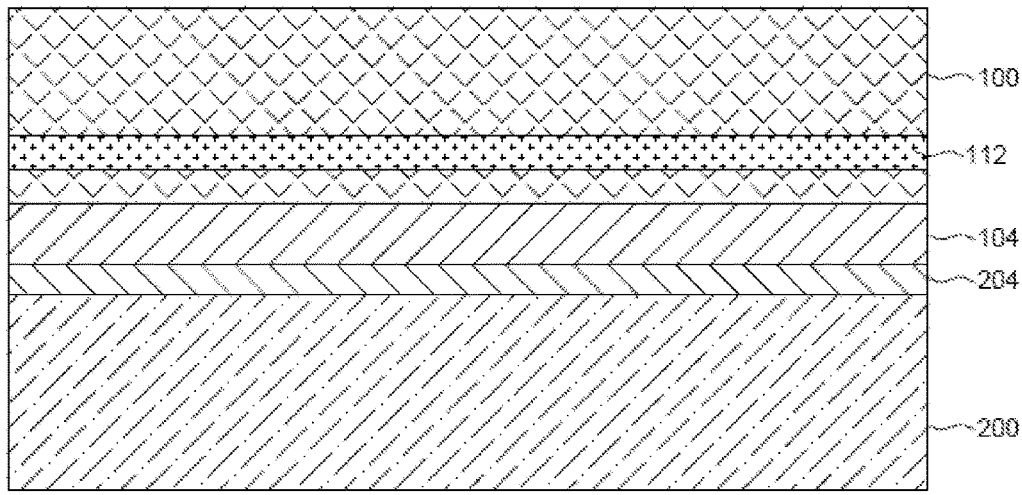

The next step is referred to FIG. 2F, the first wafer 106 is bonded with the second wafer 206 face to face. In one embodiment, the first wafer 106 is bonded with second wafer 206 through hydrophilic bonding process, wherein the first wafer 106 is bonded with second wafer 206 at a temperature between 200 centigrade degrees and 400 centigrade degrees. The detail steps of hydrophilic bonding process further comprises the steps of: wetting the first insulating layer 104 and the second insulating layer 204; contacting the wetted first insulating layer 104 with the wetted second insulating layer 204; and pressing the first insulating layer 104 and the second insulating layer 204 for closely bonding the first insulating layer 104 with the second insulating layer 204.

Figure 2G:
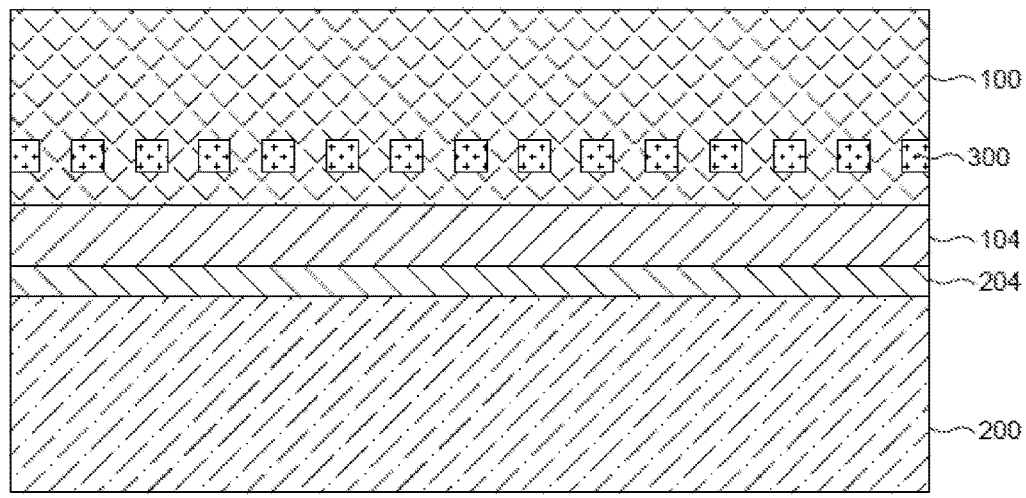

The next step is referred to FIG. 2G, the first wafer 106 and the second wafer 206 are annealed at a deuterium atmosphere. In one embodiment, a pressure of the deuterium atmosphere is between 10 torr and 1000 torr, and the annealing process comprises the steps of: heating the first wafer 106 and the second wafer 206 to a temperature between 600 centigrade degrees and 1200 centigrade degrees, wherein time for heating the first wafer 106 and the second wafer 206 is between 0.5 hours and 8 hours; cooling the first wafer 106 and the second wafer 206 to a temperature between 400 centigrade degrees and 600 centigrade degrees, wherein time for cooling the first wafer 106 and the second wafer 206 is between 30 minutes and 120 minutes. After annealing the first wafer 106 and the second wafer 206, the hydrogen doped layer 112 are transferred to a plurality of deuterium-doped bubbles 300.

Figure 2H:
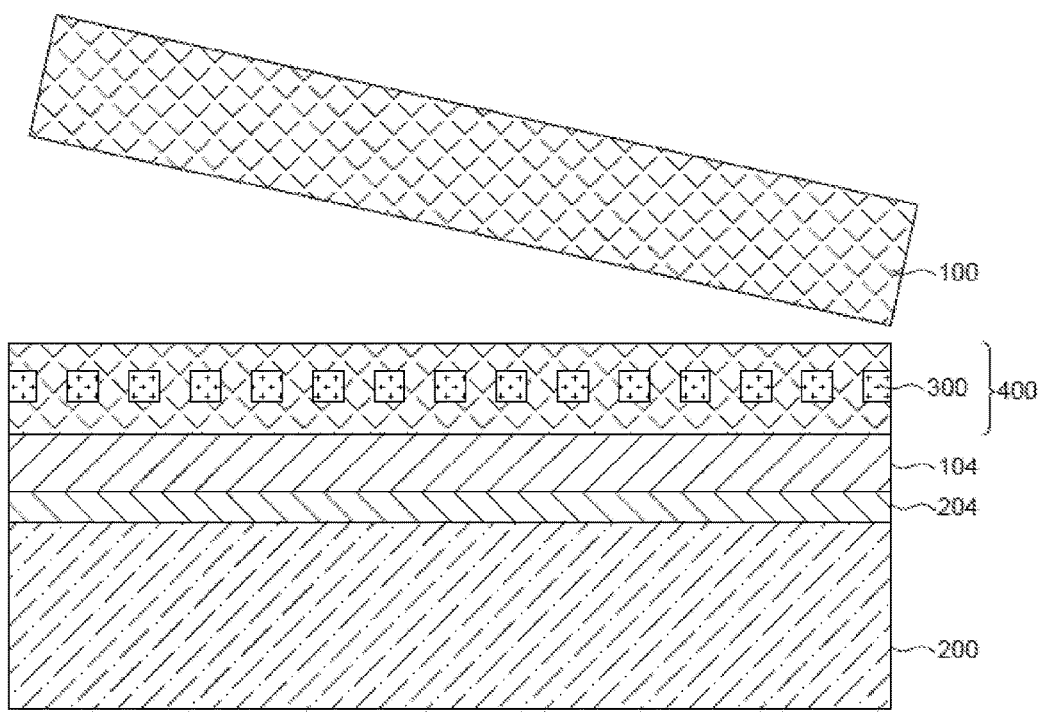

The next step is referred to FIG. 2H, a part of the first wafer 106 is separated from the second wafer 206 for forming a deuterium doped layer 400, wherein the deuterium doped layer 400 is bonded with the first insulating layer 104, wherein the hydrogen or deuterium generated bubbles 300 are in the deuterium doped layer 400. The wafer split likely happened at the region of bubbles 300. A deuterium concentration of the deuterium doped layer 400 is between $10^{10}$ atoms/cm$^3$ and $8 \times 10^{18}$ atoms/cm$^3$.

It is worth noting that the separated part of the first wafer 106 may further be proceeded with chemical-mechanical polishing (CMP) and cleaned, so that the separated part of the first wafer 106 may be reused for economizing on cost. The second wafer 106 bonded with the deuterium doped layer 400 may further be heated to a temperature between 600° C. and 1200° C., and time for heating the second wafer 106 is between 30 minutes and 8 hours.

Because a dangling bond has a higher activity, a trap center may be produced to cause that an electron is bonded with an electron hole once again. Consequently a resilience of a semiconductor device to hot carrier effects is decreased. This invention provides a SOI substrate for manufacturing a semiconductor device. The SOI substrate can reduce a parasitic capacitance between a drain and a source of the semiconductor device, deuterium atoms (or deuterium ions) doped in the SOI substrate may be diffused into an interface between a gate oxide and the SOI substrate after growing the gate oxide on the SOI substrate, and deuterium atoms (or deuterium ions) are covalently bonded to semiconductor atoms for eliminating the dangling bond and increasing the resilience of the semiconductor device to hot carrier effects. Moreover, the method for manufacturing the SOI substrate doesn't need a very high deuterium pressure, and the cost for manufacture the SOI substrate can be reduced substantially.

While various embodiments in accordance with the disclosed principles been described above, it should be understood that they are presented by way of example only, and are not limiting. Thus, the breadth and scope of exemplary embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantage.

What is claimed is:

1. A manufacturing method of silicon on insulator substrate, comprising the steps of: providing a first semiconductor substrate;
   forming a first insulating layer on a top surface of the first semiconductor substrate for forming a first wafer;
   irradiating the first semiconductor substrate via a ion beam for forming a doping layer to a pre-determined depth from a top surface of the first insulating layer;
   providing a second substrate;
   growing a second insulating layer on a top surface of the second semiconductor substrate for forming a second wafer;
   bonding the first wafer with the second wafer face to face;

annealing the first wafer and second wafer at a deuterium atmosphere such that the doping layer is transferred to a plurality of deuterium-doped bubbles;
separating a part of the first wafer from the second wafer to remain;
forming a deuterium doped layer on the second wafer, wherein the pluralities of deuterium-doped bubbles are in the deuterium doped layer; and
heating the second wafer to a temperature between 600 centigrade degrees and 1200 centigrade degrees once again after separating the part of the first wafer from the second wafer.

2. The method according to claim 1, wherein a material of the first semiconductor substrate may be Group IV, SiGe, III-V group compound, Group III-Nitrogen compound, or II-VI group compound.

3. The method according to claim 1, wherein the predetermined depth is between 0.01 μm and 5 μm.

4. The method according to claim 1, wherein the ion beam is a hydrogen ion beam, an accelerated voltage of the hydrogen ion beam is between 1 kev and 200 kev, and a doped dosage of the hydrogen ion beam is between $10^{16}$ ions/cm$^2$ and $2\times10^{17}$ ions/cm$^2$.

5. The method according to claim 1, wherein a material of the second semiconductor substrate may be Group IV, SiGe, III-V group compound, Group III-Nitrogen compound, or II-VI group compound.

6. The method according to claim 1, wherein the first wafer is boned with the second wafer face to face at a temperature between 200 centigrade degrees and 400 centigrade degrees.

7. The method according to claim 1, wherein the step of bonding the first wafer with the second wafer further includes: wetting the first insulating layer and the second insulating layer; contacting the first insulating layer with the second insulating layer; and pressing the first insulating layer and the second insulating layer for bonding the first insulating layer on the second insulating layer.

8. The method according to claim 1, wherein a pressure of the deuterium atmosphere is between 10 torr and 1000 torr.

9. The method according to claim 1, wherein a doped concentration of the deuterium doped layer is between $10^{10}$ atoms/cm$^3$ and $8\times10^{18}$ atoms/cm$^3$.

10. The method according to claim 1, wherein the step of annealing the first wafer and second wafer further includes: heating the first wafer and the second wafer to a temperature between 600 centigrade degrees and 1200 centigrade degrees; and cooling the first wafer and the second wafer to a temperature between 400 centigrade degrees and 600 centigrade degrees.

11. The method according to claim 10, wherein time for heating the first wafer and the second wafer is between 0.5 hours and 8 hours.

12. The method according to claim 10, wherein time for cooling the first wafer and the second wafer is between 30 minutes and 120 minutes.

13. The method according to claim 1, wherein a thickness of the deuterium doped layer is between 50 Å and 50000 Å.

14. The method according to claim 1, wherein time for heating the first wafer and the second wafer once again is between 30 minutes and 8 hours.

15. A silicon on insulator substrate, comprising:
a semiconductor substrate;
an insulating layer grown on a top surface of the semiconductor substrate; and
a deuterium doped layer grown on a top surface of the insulating layer, wherein a plurality of deuterium-doped bubbles are in the deuterium doped layer.

16. The silicon on insulator substrate according to claim 15, wherein a material of the semiconductor substrate may be Group IV, SiGe, III-V group compound, Group III-Nitrogen compound, or II-VI group compound.

17. The silicon on insulator substrate according to claim 15, wherein a thickness of the deuterium doped layer is between 50 Å and 50000 Å.

* * * * *